United States Patent [19]

Batcher

[11] Patent Number: 5,153,843
[45] Date of Patent: Oct. 6, 1992

[54] LAYOUT OF LARGE MULTISTAGE INTERCONNECTION NETWORKS TECHNICAL FIELD

[75] Inventor: Kenneth E. Batcher, Stow, Ohio

[73] Assignee: Loral Corporation, New York, N.Y.

[21] Appl. No.: 176,515

[22] Filed: Apr. 1, 1988

[51] Int. Cl.[5] .............................................. G06F 15/60
[52] U.S. Cl. ................................... 364/491; 364/490; 364/489; 364/488
[58] Field of Search ................ 364/488, 489, 490, 491

[56] References Cited

U.S. PATENT DOCUMENTS

| | | | |
|---|---|---|---|
| 3,681,782 | 8/1972 | Scanlon | 364/491 |
| 3,705,409 | 12/1972 | Brayton et al. | 364/488 |
| 3,800,289 | 3/1974 | Batcher | 364/200 |
| 4,495,559 | 1/1985 | Gelatt, Jr. et al. | 364/491 |
| 4,593,363 | 6/1986 | Burstein et al. | 364/491 |

OTHER PUBLICATIONS

"Outline of Interactive Printed Substrate Design System and Automatic Layout Procedure" by K. Daishidow et al., 30th National Conference of the Information Processing Society of Japan, pp. 1901-1903, 1985.
"Binary Decision Diagrams" by S. B. Akers, IEEE Transaction on Computers, vol. c-27, No. 6, Jun. 1978, pp. 509-517.

*Primary Examiner*—Vincent N. Trans
*Attorney, Agent, or Firm*—Renner, Kenner, Greive, Bobak, Taylor & Weber

[57] ABSTRACT

A technique for laying out large multistage interconnection networks. The invention provides for the division of a network into sub-networks which may be maintained on printed circuit boards and then provides for the addition of switching circuitry at the inputs or outputs of such boards such that pin locations on the boards may be swapped with each other to allow for a parallel interconnection of corresponding pins between the boards. Such parallel interconnection eliminates the existence of rat's nests in the wiring harness.

3 Claims, 3 Drawing Sheets

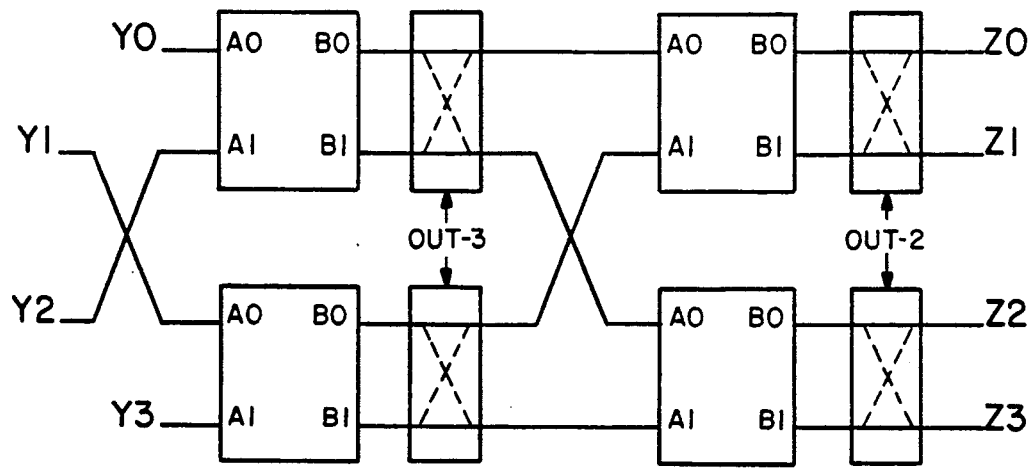
FIG.-4
| SLOT | BOARD | OUT-3 | OUT-2 |
|------|-------|-------|-------|
| S1   | L0    | 0     | 0     |
| S2   | L1    | 0     | 1     |
| S7   | L2    | 1     | 0     |
| S8   | L3    | 1     | 1     |
FIG.-5
| SLOT | BOARD | IN-1 | IN-0 |
|------|-------|------|------|
| S3   | R0    | 0    | 0    |
| S4   | R1    | 0    | 1    |
| S5   | R2    | 1    | 0    |
| S6   | R3    | 1    | 1    |
FIG.-7
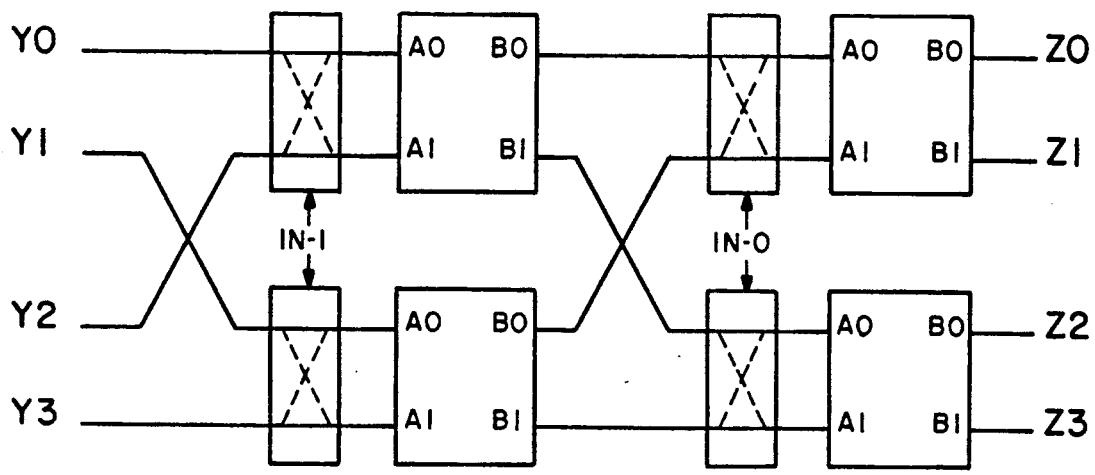
FIG.-6

|    | L00  | L01  | R00  | R01  | R10  | R11  | L10  | L11  |
|----|------|------|------|------|------|------|------|------|
| 00 | 0000 | 0001 | 0000 | 0100 | 1000 | 1100 | 0010 | 0011 |
| 01 | 0100 | 0101 | 0001 | 0101 | 1001 | 1101 | 0110 | 0111 |
| 10 | 1000 | 1001 | 0010 | 0110 | 1010 | 1110 | 1010 | 1011 |
| 11 | 1100 | 1101 | 0011 | 0111 | 1011 | 1111 | 1110 | 1111 |
|    | S1   | S2   | S3   | S4   | S5   | S6   | S7   | S8   |
FIG.-8
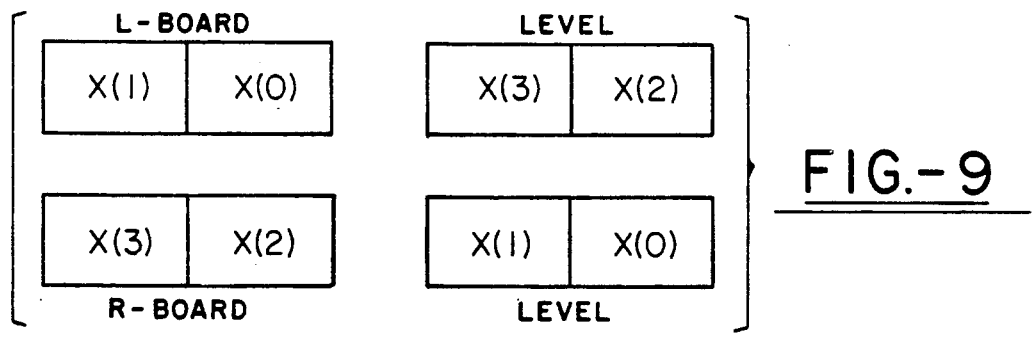
FIG.-9
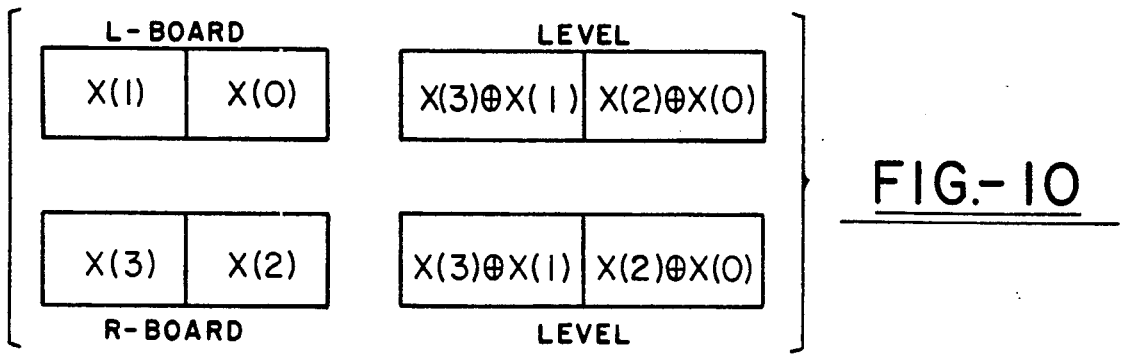
FIG.-10

LAYOUT OF LARGE MULTISTAGE INTERCONNECTION NETWORKS TECHNICAL FIELD

TECHNICAL FIELD

The invention herein resides in the art of techniques for interconnecting circuit boards containing complex and repetitive networks. More particularly, the invention provides a method for breaking up such networks and rearranging the interconnections of the elements thereof such that the interconnections will be substantially parallel to each other, eliminating the characteristic rat's nest.

BACKGROUND OF THE INVENTION

It is known that many interconnection networks used in parallel processors or other systems handling large numbers of items in parallel follow a common construction rule. Commonly known networks of this type are the flip network, bitonic sort network, the Omega network, the indirect binary n-cube, the butterfly network, and the Benes network. It is known that a small network can be put on a single printed circuit board, but that large networks must be spread across several boards. When this occurs, the wiring interconnections between boards often result in what is termed a rat's nest. The rat's nest results from the fact that wire interconnections cross each other, rather than running parallel to each other.

It is most desirable that the interconnections between the various boards maintaining portions of a large network be parallel to each other such that crisscrossing of wires is minimized. The undesirable feature of the rat's nest is, at the least, the substantial difficulty in tracing wire interconnections, coupled with the complications involved in removing or replacing wires.

DISCLOSURE OF INVENTION

In light of the foregoing, it is a first aspect of the invention to provide a technique for laying out large multistage interconnection networks in which the interconnecting wires are run parallel to each other.

Another aspect of the invention is to provide a technique for laying out large multistage interconnection networks in which control lines may be added to each board such that positions on the board can be swapped with each other to facilitate parallel interconnections of corresponding pins on the board.

Yet another aspect of the invention is the provision of a technique for laying out large multistage interconnection networks which is conducive to implementation with any of numerous types of networks, and which may be accommodated utilizing state of the art apparatus and techniques.

The foregoing and other aspects of the invention which will become apparent as the detailed description proceeds are achieved by a method for laying out multistage networks, comprising: cutting the network between stages thereof to divide the network into sub-networks of a few types; grouping the sub-networks onto boards; and providing logic control means at inputs and outputs of sub-network stages for reversing the inputs and outputs thereof.

DESCRIPTION OF DRAWINGS

For a complete understanding of the objects, techniques and structure of the invention, reference should be had to the following detailed description and accompanying drawings wherein:

FIG. 4 is schematic diagram of the addition of output switches to certain printed circuit boards to allow for standardization of certain of such boards;

FIG. 5 is a chart showing the control signal actuating the switches of the circuitry of FIG. 4;

FIG. 6 is a schematic diagram showing the utilization of input control switches to allow for the standardization of certain printed circuit boards;

FIG. 7 is a chart showing the implementation of various input control signals for the switches of the circuitry of FIG. 6;

FIG. 8 is a chart showing binary indices corresponding to the chart of FIG. 2;

FIG. 9 is a diagrammatic illustration of a rule for pin connections showing board and level positions being swapped; and FIG. 10 is another illustration of board and pin interconnections to obtain desired parallel interconnections.

BEST MODE FOR CARRYING OUT THE INVENTION

Figures 1, 2, 3:
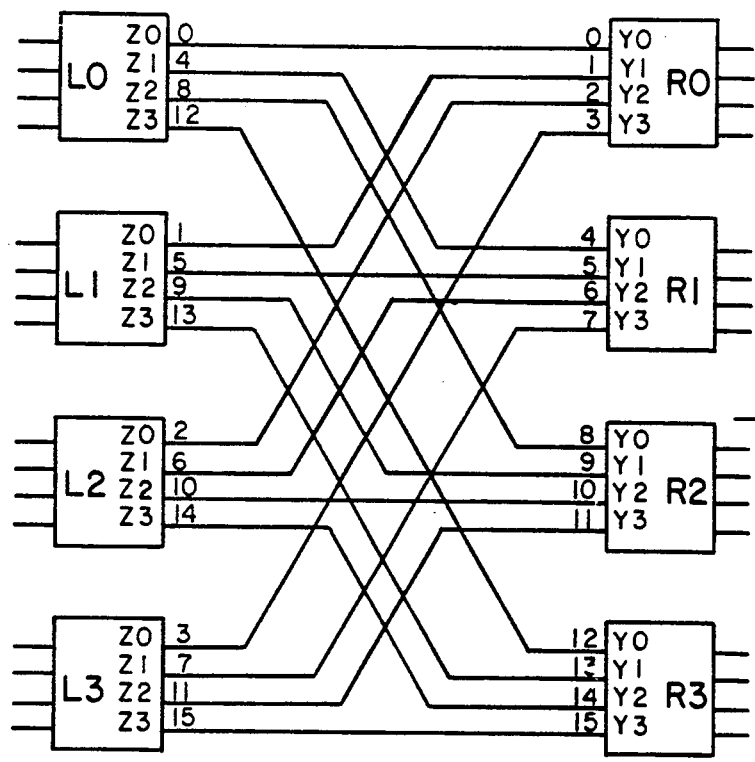
FIG. 1 is a schematic illustration of a prior art interconnection of eight printed circuit boards.
FIG. 2 is a chart illustrating the interconnection of the structure of FIG. 1.
FIG. 3 is a chart showing pin interconnections of the assembly of FIG. 1 in which the pins on the boards have been rearranged.

Assume each of the eight printed circuit boards shown in FIG. 1 is inserted into eight adjacent slots, S1 through S8, of a card nest. Boards L0, L1, L2 and L3 are put into slots S1, S2, S7 and S8, respectively. Boards R0, R1, R2 and R3 are put into slots S3, S4, S5 and S6, respectively. For i=0, 1, 2 and 3 assume that pin $Z_i$ of an L-board is in the same relative location as pin $Y_i$ of an R-board. Then the location of these pins on the backpanel of the card nest is shown in FIG. 2.

When pins with the same labels are wired together, the longest wires are the wire connecting the two pins with label 3 and the wire connecting the two pins with label 12. Both wires have the maximum horizontal distance of five slots. They also travel the maximum vertical distance. One could try to rearrange the boards within each set so that the wires with the maximum horizontal distance travel the least amount vertically and vice versa but this will not accomplish much since the wiring pattern will still look like a rat's next.

Another idea is to keep the boards in the same position and rearrange the pins of each board. For example the pins on each board can be rearranged as shown in FIG. 3. With this rearrangement all backpanel runs are horizontal. This pin arrangement not only minimizes wire length, but it also eliminates the rat's nest. If the backpanel is a printed circuit board (a motherboard) one could easily route the all-horizontal runs of the interconnections on a layer of the board.

In FIG. 2, the boards in slots S1, S2, S7 and S8, are all such that one board type suffices for all four boards. In FIG. 3, the pins on the boards in slots S2, S7 and S8 have been rearranged. Note that the board in slot S2 has outputs Z0 and Z1 swapped and outputs Z2 and Z3 swapped. In other words, bit position 2 of the line indices is complemented. The board in slot S7 as outputs Z0 and Z2 swapped and outputs Z1 and Z3 swapped. In other cases, bit positions 2 and 3 of the line indices are complemented.

Applicant has found that the following two theorems may be employed to simplify the layout of large networks.

Theorem 1:

Given an m-stage, N-line network, let stage i have key bit position p. Let stages i+1, i+2,..., m be regular and have key bit positions not equal to p. If one complements bit position p in all line indices in line-sets i, i+1,..., m then any element in stage i with standard outputs gets reversed outputs, any element in stage i with reversed outputs gets standard outputs, and no effects are caused in the later stages except for the permutation of line indices.

Theorem 2:

Given an m-stage, N-line network, let stage i have key bit position p. Let stages 1, 2,..., i−1 be regular and have key bit positions not equal to p. If one complements bit positions p in all line indices in line-sets 0, 1,..., i−1 then any element in stage i with standard inputs gets reversed inputs, any element in stage i with reversed inputs gets standard inputs, and no effects are caused in the earlier stages except for the permutation of line indices.

Each L-board is a 2-stage, 4-line network and one can apply theorem 1 to the sub-network on the board. On the board in slot S2, one reverses the outputs of the elements in the last sub-network stage to complement bit 2 of its output line indices. On the board in slot S7, one reverses the outputs of the elements in the first sub-network stage to complement bit 3 of the output line indices. On the board in slot S8, one reverses the outputs of all elements to complement bits 2 and 3 of the output line indices.

If a switch is added to the outputs of each element, one may obtain a single board type that suffices for all four boards in slots S1, S2, S7 and S8 as shown in FIG. 4. Each switch has two states controlled by a control line (OUT3 or OUT2). If the control line has a value of 0, the switch passes the B0 and B1 data outputs straight across to the right. If the control line has a value of 1, the switch reverses the B0 and B1 data outputs as it passes their data to the right.

Control line OUT3 reverses the outputs of the first-stage elements and control line OUT2 reverses the outputs of the second-stage elements. The control lines are brought out to backpanel connection pins. The OUT3 and OUT2 pins in slots S1, S2, S7 and S8, of the card nest are wired to 0 and 1 values as shown in FIG. 5.

Thus a single board type suffices for the boards in slots S1, S2, S7 and S8. When a board is inserted into one of these slots, control lines OUT3 and OUT2 are set to the values required to permute the data outputs of the board as shown in FIG. 3.

In a similar manner, one can make one board type suffice for the boards in slots S3, S4, S5 and S6. As shown in FIG. 6, a switch is added on the input side of each element. Two control lines, IN1 and IN0, control these switches. Control line IN1 reverses the inputs to the first-stage elements- The IN1 and IN0 pins in slots S3, S4, S5 and S6 of the card nest are wired as shown in FIG. 7.

Another way to show this example is to replace each line index, X, of FIG. 2 with its four bit binary representation, (X(3), X(2), X(1), X(0)). The indices of boards L0, L1, L2 and L3, are changed to L00, L01, L10, and L11, respectively. The indices of boards R0 through R3 are also changed in a similar manner. The four levels of connection pins in FIG. 2 are indexed with two-bit binary vectors, 00, 01, 10, 11, reading top down. FIG. 8 shows the original backpanel connections with these indices.

The location of the connection pins satisfies the following rule. In slots S1, S2, S7 and S8, connection pin (X(3), X(2), X(1), and X(0)) is located on level (X(3),X(2)) of board L(X(1),X(0)). In slots S3, S4, S5 and S6, the pin is located on level (X(1),X(0)). FIG. 9 shows a diagram for this rule.

Thus the board and level positions of any connection line are swapped as the line travels from an L-board to an R-board. Only lines where $X(3)=X(1)$ and $X(2)=X(0)$ stay on the same level. These are lines 0, 5, 10 and 15.

The pin locations of FIG. 3 follow the rule diagrammed in FIG. 10. ($\oplus$ represents the exclusive-or operator).

The board locations are the same as in FIG. 9. The level locations are now the same for the outer and inner slots so every backpanel connections stays on the same level as it travels between an L-board and an R-board. Note that control line OUT3=X(1) and control line OUT2 X(0) in the outer slots. These control lines move each L-board pin from the (X(3),X(2)) level of FIG. 9 to the $(X(3)\oplus X(1), X(2)\oplus X(0))$ level of FIG. 10. In the inner slots control line IN1=X(3) and control line IN0=X(2). These control lines move each R-board pin from the (X(1),X(0)) level of FIG. 9 to the $(X(3)\oplus X(1), X(2)\oplus X(0))$ level of FIG. 10.

The procedures just described can be applied in the layout of any large multistage interconnection network. Given such a network the basic steps are:

1. Cut the network between stages at one or more places to divide it up into a number of sub-networks of a few types.
2. Add logic at the inputs and outputs of every element so a control bus (IN) can reverse the inputs of all elements in a sub-network stage and another control bus (OUT) can reverse the outputs of all elements in a sub-network stage.
3. Group the sub-networks onto boards.
4. Place the boards in card nests.
5. Wire the IN and OUT control bus lines of each board to 0 and 1 values.

Thus is can be seen that the objects of the invention have been satisfied by the structure and techniques presented hereinabove. While in accordance with the patent statutes, only the best mode and preferred embodiment of the invention has been presented and described in detail, it is to be understood that the invention is not limited thereto or thereby. Accordingly, for an appreciation of the true scope and breath of the invention reference should be had to the following claims.

What is claimed is:

1. A method for laying out multistage networks, comprising:
   cutting the network between stages thereof to divide the network into subnetworks of a few types;
   grouping the sub-networks onto boards;
   providing logic control means at inputs and outputs of sub-network stages for reversing the input and outputs thereof, wherein said control means comprises a first control bus for reversing inputs of all elements in a sub-network stage, a second control bus for reversing outputs of all elements in a sub-network stage, and digital switches selectively actuated by the application thereto of a logic 0 to 1.

wiring said first and second buses to logic 0 and 1 values; and wherein each said board is designated by a unique binary index, each board having pins designated by binary indices, each pin of each board being uniquely connected to a pin of another board by a line having a unique binary index.

2. The method according to claim 1 wherein said network is an m-stage, N-line network, stage i has a key bit position p, stage i+1,..., m are regular and have key bit positions not equal to p, which includes the step of complementing bit position p in all line indices in line-sets i, i+1,..., m such that any element in stage i with standard outputs gets reversed outputs, any element in stage i with reversed outputs gets standard outputs, and no effects are caused in the later stages except for the permutation of line indices.

3. The method according to claim 2 wherein stages 1, 2,..., i-1 are regular and have key bit positions not equal to p, including the step of complementing bit position p in all line indices in line-sets 0, 1,..., i-1 such that every element in stage i with standard inputs gets reversed inputs, every element in stage i with reversed inputs gets standard inputs, and no effects are caused in the earlier stages except for permutation of line indices.

* * * * *